(12) United States Patent
Park et al.

(10) Patent No.: US 9,241,434 B2
(45) Date of Patent: Jan. 19, 2016

(54) NANO COMPOSITE CONSISTING OF CARBON NANOTUBES AND METAL OXIDE AND METHOD FOR MANUFACTURING THE SAME

(71) Applicant: BIONEER CORPORATION, Daejeon (KR)

(72) Inventors: Han Oh Park, Daejeon (KR); Jae Ha Kim, Daejeon (KR); Kuk Jin Yun, Daejeon (KR)

(73) Assignee: BIONEER CORPORATION, Daejeon (KR)

( * ) Notice: Subject to any disclaimer, the term of this patent is extended or adjusted under 35 U.S.C. 154(b) by 23 days.

(21) Appl. No.: 14/241,938

(22) PCT Filed: Sep. 26, 2012

(86) PCT No.: PCT/KR2012/007731
§ 371 (c)(1),
(2) Date: Feb. 28, 2014

(87) PCT Pub. No.: WO2013/048095
PCT Pub. Date: Apr. 4, 2013

(65) Prior Publication Data
US 2014/0291583 A1    Oct. 2, 2014

(30) Foreign Application Priority Data

Sep. 28, 2011  (KR) .......................... 10-2011-0098076

(51) Int. Cl.
| | |
|---|---|
| *C01B 31/02* | (2006.01) |
| *H05K 9/00* | (2006.01) |
| *B82Y 40/00* | (2011.01) |
| *B82Y 30/00* | (2011.01) |
| *H01B 1/08* | (2006.01) |
| *H01B 1/04* | (2006.01) |

(52) U.S. Cl.
CPC ................ *H05K 9/009* (2013.01); *B82Y 30/00* (2013.01); *B82Y 40/00* (2013.01); *C01B 31/0253* (2013.01); *C01B 31/0273* (2013.01); *H01B 1/04* (2013.01); *H01B 1/08* (2013.01)

(58) Field of Classification Search
None
See application file for complete search history.

(56) References Cited

U.S. PATENT DOCUMENTS

| 8,018,563 B2 | 9/2011 | Jones et al. | |
|---|---|---|---|
| 2009/0042028 A1* | 2/2009 | Kim et al. | ..................... 428/367 |
| 2010/0055568 A1 | 3/2010 | Kim et al. | |

FOREIGN PATENT DOCUMENTS

| JP | 2007-314776 A | 12/2007 |
|---|---|---|
| KR | 10-2002-0096068 A | 12/2002 |
| KR | 10-0616071 B1 | 8/2006 |
| KR | 10-0778094 B1 | 11/2007 |
| KR | 10-2009-0009419 A | 1/2009 |
| WO | 2010/110624 A2 | 9/2010 |
| WO | 2010-110626 A2 | 9/2010 |

OTHER PUBLICATIONS

Japanese Patent Office, Communication dated Feb. 4, 2015 issued in counterpart application No. 2014-530609.
Lu, Jinshan "Effect of surface modifications on the decoration of multi-walled carbon nanotubes with ruthenium nanoparticles," Carbon, 2007, vol. 45, No. 8, pp. 1599-1605 (7 pages total).
International Searching Authority, International Search Report for PCT/KR2012/007731 dated Feb. 28, 2013.

\* cited by examiner

*Primary Examiner* — Tanisha Diggs
(74) *Attorney, Agent, or Firm* — Sughrue Mion, PLLC

(57) ABSTRACT

Provided are a method for manufacturing a carbon nanotube-metal oxide composite, and a carbon nanotube-metal oxide composite manufactured thereby, the method comprising: dispersing carbon nanotubes in a reductive solvent to prepare a dispersion liquid; adding a co-reducing agent and a metal precursor to the dispersion liquid to prepare a mixture liquid; and performing heat treatment on the mixture liquid to coat the metal precursor on the carbon nanotubes in a metal oxide form, so that there can be provided a carbon nanotube-metal oxide composite where metal oxide particles of several nm to several tens of nm are uniformly dispersed in carbon nanotubes or combined with surfaces of the carbon nanotubes in a coating type.

4 Claims, 9 Drawing Sheets

NANO COMPOSITE CONSISTING OF CARBON NANOTUBES AND METAL OXIDE AND METHOD FOR MANUFACTURING THE SAME

CROSS REFERENCE TO RELATED APPLICATIONS

This application is a National Stage of International Application No. PCT/KR2012/007731 filed Sep. 26, 2012, claiming priority based on Korean Patent Application No. 10-2011-0098076, filed Sep. 28, 2011, the contents of all of which are incorporated herein by reference in their entirety.

TECHNICAL FIELD

The present invention relates to a nano composite consisting of carbon nanotubes and metal oxide combined with each other and a method for manufacturing the same. More particularly, the present invention relates to a carbon nanotube-metal oxide composite where metal oxide particles of several nm to several tens of nm are uniformly dispersed in carbon nanotubes and the metal oxide particles are combined with a surface of the carbon nanotubes in a coating type, and a method for manufacturing the same.

BACKGROUND ART

Carbon nanotubes may be applied in various fields as a material for the vehicle industry, electronic industry, defense industry, energy industry, and environmental industry due to excellent mechanical strength, thermal conductivity, electric conductivity, and chemical stability thereof. In 1991, Dr. Iijima of NEC found a thin and long tube-shaped carbon nanotube in the procedure where a carbon formed on a graphite negative electrode by using an electrical discharge method was analyzed through a transmission electron microscope (TEM), which was first published in the Journal of Nature, and this was the beginning of carbon nanotube. The carbon nanotube is that a graphite surface is rolled in a nano-sized diameter, and exhibits metal or semiconductor characteristics depending on the rolling angle and structure of the graphite surface. The carbon nanotube is anticipated to be applied as an ultrafine connection line, an ultrafine pipe, an ultrafine liquid injection apparatus, a gas sensor, and a medical material using affinity with biological tissues. An application of the carbon nanotubes that shields and absorbs electromagnetic waves is one of the fields that have actively been studied in recent. In addition, the application of carbon nanotubes is actively studied as a material for a solar cell or a fuel battery, which is spotlighted as an alternative energy source, and a material for vehicle components requiring a small weight and a high strength.

However, a carbon nanotube-metal composites and metal oxide composites have higher performances than the carbon nanotube itself, for electronic industry materials, such as an electrode material for a field emission type flat panel display, a fuel cell, and a solar cell, a hydrogen storage material for a fuel cell, an electromagnetic wave shielding and absorbing material, an electronic ink source material, and the like; and high-strength materials, such as high-strength light-weight tool steel, high-strength light-weight vehicle parts, and defense industry materials. This is a new material obtained by inducing a functional group to the carbon nanotube and allowing the induced functional group to react with metal (iron, tin, aluminum, titanium, or the like) to thereby chemically combine them. Due to the metal component contained therein, this has superior characteristics in molding structure bodies, such as, manufacturing a field emission display, manufacturing a hydrogen storage device combined body, manufacturing an electrode, manufacturing a super capacitor, manufacturing an electromagnetic shielding and absorbing body, manufacturing a small-weight and high-strength application product, and the like. Particularly, the carbon nanotube-metal and carbon nanotube-metal oxide may be used for manufacturing the electromagnetic shielding and absorbing body. Currently, silver, iron oxide, and the like are used for manufacturing the electromagnetic shielding and absorbing body. Particularly, ferrite, carbonyl iron, or the like may be used as the iron oxide in the electromagnetic absorbing body, and thus, the development of a material that can substitute for them is requested. The ferrite as the iron oxide has less magnetism than iron itself, but, currently, has been widely used due to long-term material stability thereof.

The carbon nanotube-metal and carbon nanotube-metal oxide have different metal properties from the existing metals in the case where the metal and the metal oxide particles combined therein have a nano-level size. The representative physical property change is that the melting point of metal becomes reduced. In addition, the smaller the size of the metal nanoparticle combined, the lower the melting point. This change makes the carbon nanotube-metal composites and metal oxide composites have different physical properties from the existing materials, resulting in new material characteristics, thereby allowing various applicability.

Korean Patent Nos. 10-616071 and 10-778094 disclose a method of reducing a metal precursor by inputting the metal precursor and a reducing agent in a carbon nanotube-dispersed solvent. However, in the above patents, a reducing reaction due to the input of the reducing agent is not uniform in the entire reaction liquid, and thus, the particle size is not uniform and the dispersibility is degraded.

DISCLOSURE

Technical Problem

An object of the present invention is to provide a carbon nanotube-metal oxide composite where metal oxide particles of several nm to several tens of nm are uniformly dispersed in carbon nanotubes or combined with surfaces of the carbon nanotubes in a coating type, and a method for manufacturing the same.

Another object of the present invention is to provide a carbon nanotube-metal oxide composite where metal oxide nanoparticles having a smaller and more uniform size are uniformly dispersed in carbon nanotubes or combined with the carbon nanotubes in a coating type, by controlling the size and shape of the metal oxide particle combined with the carbon nanotube, and a method for manufacturing the same.

Technical Solution

As the result of a repeated study for achieving the objects, the present inventors found that there can be manufactured a carbon nanotube-metal oxide composite where metal oxide particles are uniformly dispersed in and combined with carbon nanotubes, the metal oxide particles being reduction-reacted by dispersing carbon nanotubes in a reductive solvent selected from polyhydric alcohols, adding a co-reducing agent selected from glycol ethers and a metal precursor thereto, and then performing heat treatment thereon. Particularly, the present inventors found that reactivity of the metal oxide particles can be improved by using the co-reducing agent in the procedure where the metal oxide particles are formed by a reduction reaction of a metal precursor; the size and shape of the generated metal oxide particles can be controlled by changing the heat treatment reaction temperature; and the sizes of the metal oxide particles can be decreased and the metal oxide particles can be formed on the surface of the carbon nanotube in a coating type by lowering the reaction temperature.

The reductive solvent according to the present invention can serve to disperse carbon nanotubes and reduce a metal precursor; advance a reduction reaction at an appropriate rate to form uniform-sized metal oxide particles since polyhydric alcohols used as the reductive solvent and glycol ethers as a co-reducing agent have a moderate reducing power; and suppress the coagulation of the formed metal oxide particles to thereby uniformly disperse the metal oxide particles in the manufactured carbon nanotube-metal oxide composite. Further, the size and shape of the above-described reduced metal oxide particle can be controlled according to the heat treatment temperature for the reduction reaction.

Hereinafter, the present invention will be described in detail.

The present invention is directed to a method for manufacturing a carbon nanotube-metal oxide composite, the method including:

dispersing carbon nanotubes in a reductive solvent to prepare a dispersion liquid;

adding a co-reducing agent and a metal precursor to the dispersion liquid to prepare a mixture liquid; and performing heat treatment on the mixture liquid to coat the metal precursor on the carbon nanotubes in a metal oxide form.

In the method according to the present invention, the carbon nanotube may include a single wall CNT, a double wall CNT, a thin multi-wall CNT, and a multi-wall CNT.

In the present invention, the principle of combining the metal oxide with the carbon nanotube is as follows. For example, a commercial carbon nanotube has a defect site present on a surface thereof, and an anion functional group such as a carboxyl group is known to be induced at this defect site due to the nature of a carbon nanotube purification process (M. W. Marshall et. al., Carbon, Vol 44, p 1137-1141, 2006). A metal catalyst used when carbon nanotubes are formed by chemical vapor deposition (CVD) needs to be removed, and the metal catalyst is melted and removed by using hydrochloric acid or nitric acid in a purification process. Here, the acid is contacted with the carbon nanotube, and the contacted acid induces a carboxyl group onto a surface of the carbon nanotube. In the case where more functional groups are needed for the carbon nanotube, treatment with strong acid may be performed in order to further induce the carboxyl group. When the carbon nanotube having an anion functional group such as the carboxyl group is contacted with a solution obtained by dissolving metal salt in a liquid, the dissolved cationic metal is combined around the carboxyl group in a precursor form. When the reaction is advanced by using a reducing agent while the temperature is raised, the reacted metal oxide is combined with the carbon nanotube, thereby manufacturing a carbon nanotube-metal oxide composite. Here, it is recognized that a co-reducing agent present together with the metal precursor in the mixture liquid is combined around the cationic metal and the reduced metal, to thereby allow a reaction of the metal to occur well and prevent the generated metal oxide particles from agglomerating and gathering. Hence, this case allows smaller and more uniform metal oxide particles to be uniformly dispersed in the carbon nanotubes as compared with a case where the co-reducing agent is not used.

Hereinafter, the method for manufacturing a carbon nanotube-metal oxide composite according to the present invention will be described by stages.

In a first stage for manufacturing a carbon nanotube-metal oxide composite according to the present invention, a dispersion liquid is prepared by dispersing carbon nanotubes in a reductive solvent. Generally, a reaction may be advanced by inputting carbon nanotubes in the inorganic solvent and then inputting a reducing agent thereto. However, the present invention is characterized in that an economically cheap reducing agent is used as a solvent to advance a neat reaction, thereby performing a more complete reduction reaction of metal. It is known that examples of the reducing agent generally used may include sodium borohydride, hydrazine, and the like. However, these reducing agents have good reducing power, but they are expensive, and thus have a disadvantage in production costs. In the manufacturing method of the present invention, polyhydric alcohol that has an advantage in production costs due to low purchase cost thereof is used as a neat, to thereby serve as two functions, a solvent and a reducing agent. Resultantly, according to the manufacturing method of the present invention, the manufacturing method is simplified since a separate reducing agent is not used, and the reduction reaction is advanced over the entire reaction liquid at a uniform and appropriate rate since the solvent acts as a reducing agent and the reducing power thereof is moderate. Hence, the sizes of the metal oxide particles generated by a reduction reaction of the metal precursor are uniform within several nm to several tens of nm, or the metal oxide particles are uniformly formed on the surface of the carbon nanotube in a coating type. Also, the metal oxide particles are almost spherical, and have a morphological uniformity.

The reductive solvent according to the present invention is preferably polyhydric alcohol, which is a compound having two or more hydroxy (—OH) groups. At least one selected from the group consisting of glycols of Chemical Formula 1 below, glycerin, threitol, arabitol, glucose, mannitol, galactitol, and sorbitol may be used. More preferable are glycols. A material having a high melting point, such as, threitol, arabitol, glucose, mannitol, galactitol, or sorbitol is more preferably used mixingly with a reductive solvent having a low melting point.

  [Chemical Formula 1]

(wherein, $R_1$ is independently selected from $C_2$~$C_{10}$ straight or branched chain alkylene; and n is independently an integer of 1 to 100)

A compound included in the glycols may be at least one selected from the group consisting of ethylene glycol, diethylene glycol, triethylene glycol, tetraethylene glycol, polyethylene glycol, propylene glycol, dipropylene glycol, polypropylene glycol, hexylene glycol, and the like, and more preferable are ethylene glycol and triethylene glycol, but is not necessarily limited thereto.

In the manufacturing method according to the present invention, the carbon nanotubes may be dispersed in the reductive solvent by using the known methods, but the dispersion performed by ultrasonic treatment is more preferable since it facilitates the manufacturing method and improves dispersibility of the carbon nanotubes. It may be confirmed by an electron microscope that carbon nanotubes at the time of purchase are generally tangled. Since this tangle of carbon nanotubes may be an obstacle in uniformly dispersing the metal oxide particles, the dispersion of carbon nanotubes are preferably performed at the time of manufacturing the carbon nanotube-metal oxide composite.

In a second stage for the manufacturing method according to the present invention, a mixture liquid is prepared by adding a co-reducing agent and a metal precursor to the dispersion liquid of carbon nanotubes.

As described above, it is more preferable to use the glycol ether based compound as the co-reducing agent mixingly with the reductive solvent, so that the uniformity in the size of the metal oxide particle and the dispersibility of metal oxide particles with respect to the carbon nanotubes are excellent and the metal oxide particles are almost spherical and thus has uniform characteristics in the shape thereof. Preferably, glycol ethers as a co-reducing agent may be used mixingly with the reductive solvent, and more preferably, glycols as a reductive solvent and methyl polyglycol as a co-reducing agent may be used mixingly with each other.

The glycol ethers as a co-reducing agent according to the present invention may mean one where any one or two of the hydroxy groups of glycol are substituted with alkyl, aryl alkylcarbonyl, or the like, and may be at least one selected from compounds of Chemical Formula 2 below. More preferably, glycol ether having one hydroxy group may be used.

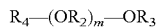  [Chemical Formula 2]

(wherein, $R_2$ is independently selected from $C_2$~$C_{10}$ straight or branched chain alkylene; $R_3$ is a hydrogen atom, allyl, $C_1$~$C_{10}$ alkyl, $C_5$~$C_{20}$ aryl, or $C_6$~$C_{30}$ aralkyl; $R_4$ is selected from allyl, $C_1$~$C_{10}$ alkyl, $C_5$~$C_{20}$ aryl, $C_6$~$C_{30}$ aralkyl, and $C_2$~$C_{10}$ alkylcarbonyl, and alkyl of the alkylcarbonyl may include a double bond in a carbon chain; and m is independently an integer of 1 to 100)

Examples of the compound included in the glycol ether may include one or a mixture of two or more selected from the group consisting of methyl glycol, methyl diglycol, methyl triglycol, methyl polyglycol, ethyl glycol, ethyl diglycol, butyl glycol, butyl diglycol, butyl triglycol, butyl polyglycol, hexyl glycol, hexyl diglycol, ethyl hexyl glycol, ethyl hexyl diglycol, allyl glycol, phenyl glycol, phenyl diglycol, benzyl glycol, benzyl diglycol, methyl propylene glycol, methyl propylene diglycol, methyl propylene triglycol, propyl propylene glycol, propyl propylene diglycol, butyl propylene glycol, butyl propylene diglycol, phenyl propylene glycol, methyl propylene glycol acetate, and the like, but are not necessarily limited thereto.

In the second stage, the metal precursor is selected from compounds containing a metal component and a mixture thereof, but the kind of metal component may not be limited. Any compound containing a metal component selected from Ti, V, Cr, Mn, Fe, Al, and Sn or a mixture thereof may be used. The common feature of these metal components is that they are reduced so as to be synthesized in a metal oxide form, and are metals having low reduction potential values.

In the manufacturing method according to the present invention, as the metal precursor, examples of an inorganic metal salt may include a hydroxy compound, a carbonate compound, a chloride compound, a sulfate compound, and a nitrate compound, and examples of an organometal composite compound may include a carboxylate compound of Chemical Formula 3 below, a β-diketonate compound, a hydrate thereof, and a mixture thereof.

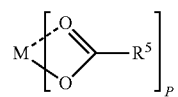  [Chemical Formula 3]

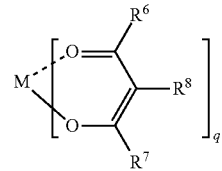  [Chemical Formula 4]

(wherein, M is selected from Ti, V, Cr, Mn, Fe, Al, and Sn; $R_5$, $R_6$ and $R_7$ each are independently selected from allyl, $C_1$~$C_{10}$ alkyl, $C_5$~$C_{20}$ aryl, and $C_6$~$C_{30}$ aralkyl; $R_8$ is selected from a hydrogen atom and $C_1$~$C_7$ alkyl; and p and q each are independently a valence of M)

The metal component (M) in the metal precursor compound is preferably selected from Ti, V, Cr, Mn, Fe, Al, and Sn. Examples of the metal precursor compound may include at least one selected from aluminum chloride, aluminum acetyl acetonate, aluminum acetate, aluminum nitrate, manganese carbonate, manganese chloride, manganese nitrate, manganese acetyl acetonate, manganese acetate, iron hydroxide, iron chloride, iron acetyl acetonate, iron acetate, iron nitrate, titanium chloride, titanium acetyl acetonate, titanium sulfate, tin chloride, tin ethyl hexanoate, a hydrate thereof, and the like, but are not necessarily limited thereto.

In a third stage of the manufacturing method according to the present invention, a reduction reaction of the metal precursor is advanced by performing heat treatment on the mixture of carbon nanotubes and the metal precursor. Preferably, an inside of a reactor may be replaced with an inert gas such as nitrogen or the like. This inert gas may serve to prevent the nano metal oxide formed after the reaction from being exploded at a high temperature. After the inside of the reactor is replaced with the inert gas, the mixture liquid is raised to a predetermined temperature or higher to thereby induce the reaction. The reductive solvent according to the present invention has no effects as a reducing agent in room temperature, but when the temperature thereof is raised to a predetermined temperature or higher, the reduction reaction is induced. Since the heat treatment temperature may vary depending on the component ratio of the reductive solvent, it is not necessary to limit the range of rising temperature, but a temperature range of 50° C. to 300° C. is appropriate. If the temperature is below 50° C., the reduction reaction is not well advanced, and thus, metal oxide nanoparticles are not easily formed. If the temperature is too high, above 300° C., component materials of the mixture liquid may be decomposed and evaporated, failing to advance a stable reaction, and a reaction at a too high temperature may be unfavorable in an economical view.

In the manufacturing method according to the invention, the heat treatment temperature for the reduction reaction is an important factor. As for formation of the metal oxide nanoparticles according to the reaction temperature above a predetermined temperature at which the reduction reaction occurs, the lower the reaction temperature, the lower the reaction rate, and thus, it can be confirmed that the size of the generated metal oxide particle becomes smaller. Hence, the rate of the reduction reaction is controlled by varying the heat treatment temperature for the reduction reaction, thereby controlling the size or shape of the metal oxide particle.

In addition, the manufacturing method according to the present invention may further include general filtering, washing, and drying, after the third stage.

Scanning electron microscope (SEM) images of carbon nanotube-iron oxide composites manufactured according to examples of the present invention are shown in FIGS. 1, 3, 4, and 5. Referring to FIGS. 1, 3, 4, and 5, it can be confirmed that, in the carbon nanotube-iron oxide composites manufactured by the manufacturing method according to the present invention, iron oxide particles are uniformly dispersed; the sizes of the iron oxide particles are uniform within the range of several nm to several tens of nm, more preferably within the range of 1 nm to 50 nm; and the iron oxide particles are almost spherical and combined with the carbon nanotubes. In addition, it can be confirmed that in the case where the heat treatment temperature for the reduction reaction is low but a predetermined temperature, the generated iron oxide particles are formed on surfaces of the carbon nanotubes in a coating type. In addition, a scanning electron microscope (SEM) image of a carbon nanotube-tin oxide composite manufactured according to another example of the present invention is shown in FIG. 6 and transmission electron microscope (TEM) images thereof are shown in FIGS. 8 and 9. It can be confirmed from the images, that in the carbon nanotube-tin oxide composite manufactured according to the present invention, tin oxide particles are uniformly dispersed and the size of the tin oxide particles are within the range of several nm to several tens of nm.

Advantageous Effects

As set forth above, according to the method for manufacturing a carbon nanotube-metal oxide composite of the present invention, economically cheap polyhydric alcohol is used as a reductive solvent and glycol ether is used as a co-reducing agent, so that they can be easily manufactured a carbon nanotube-metal oxide composite where nano-sized metal oxide nanoparticles are spherical and uniformly dispersed in the carbon nanotubes or the metal oxide is uniformly combined with the surface of the carbon nanotube in a coating type. Further, the forming type of the metal oxide on the surface of the carbon nanotube can be controlled by the heat treatment temperature for the reduction reaction, and the carbon nanotube-metal oxide composite manufactured according to the present invention can be used as a material for an electronic industry, such as electromagnetic wave shielding and absorbing.

DESCRIPTION OF DRAWINGS

The above and other objects, features and advantages of the present invention will become apparent from the following description of preferred embodiments given in conjunction with the accompanying drawings, in which.

BEST MODE

Hereinafter, the present invention will be described in detail by examples. The following examples are for merely exemplifying the present invention, and therefore, the scope of the present invention is not limited to the following examples.

Example 1

Figure 1:
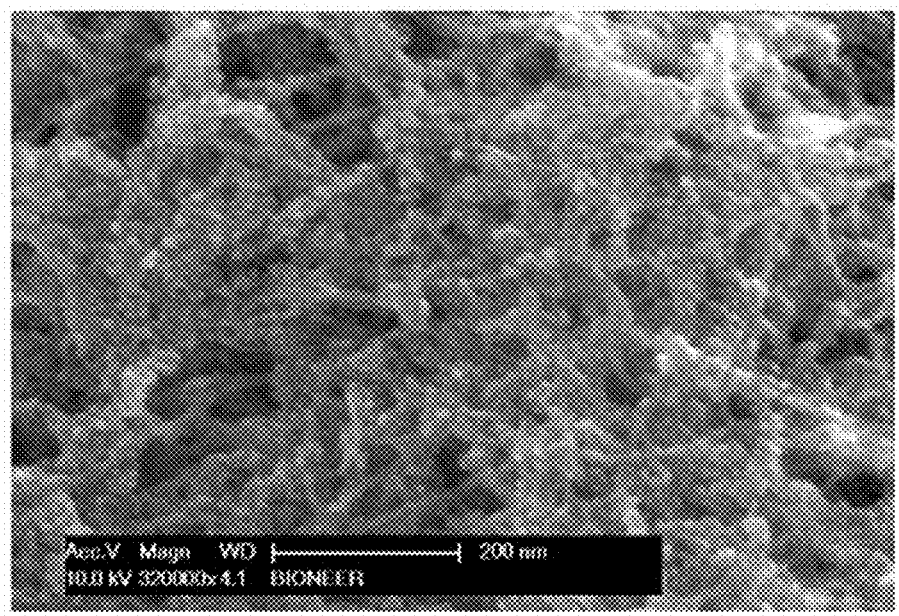
FIG. 1 is a scanning electronic microscope (SEM) image of a carbon nanotube-iron oxide composite manufactured in Example 1.
Figure 2:
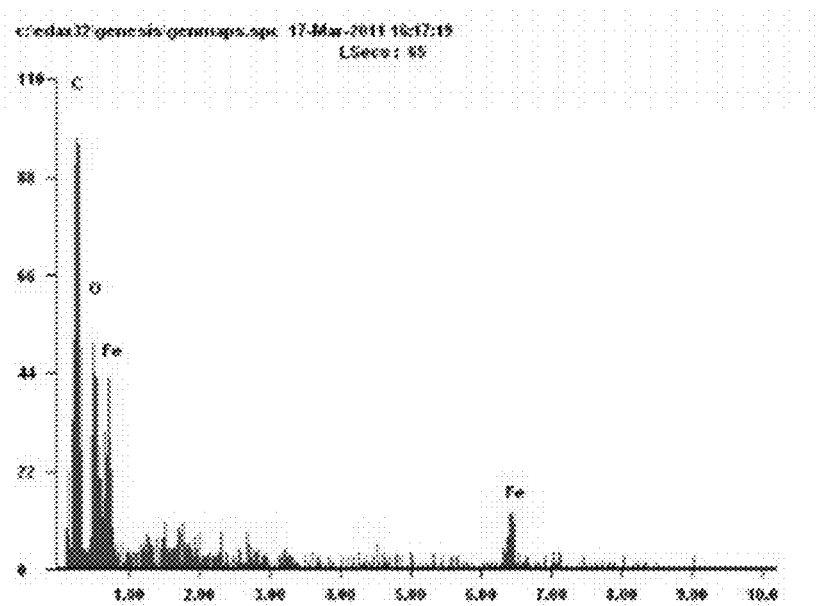
FIG. 2 shows an EDS analysis result of the carbon nanotube-iron oxide composite manufactured in Example 1.

Manufacture of Carbon Nanotube-Iron Oxide Composite Using Multi-Wall Carbon Nanotube 0.3 g of multi-wall carbon nanotubes (Cheil Industries Inc.; Multi-wall CNT grade) were put in a 500 ml four-neck round flask reactor, and 280 ml of triethylene glycol was put in the round flask reactor. After stirring for 30 minutes by using an equipped stirrer, the reactor was placed in an ultrasonic wave washing machine, and then the carbon nanotubes were dispersed in the triethylene glycol for 3 hours by using ultrasonic waves. Here, the temperature of the reactor should not exceed 50° C. After the ultrasonic treatment was completed, the stirrer was again equipped with the reactor and then a thermometer and a cooling condenser were connected thereto. While the reactor was stirred, 4.26 ml of methyl polyglycol ($CH_3(OCH_2CH_2)_nOH$, n=4~5, Hannon Chemicals Inc., Product Name: MPG) was put thereinto, and then 1.89 g of Fe(III)-acetylacetonate was put thereinto. A vacuum pump was connected to the reactor to remove air inside the reactor, which was then replaced with nitrogen. A mantle was installed below the flask reactor. The inside temperature of the reactor was raised to 290° C. over 40 minutes for heat treatment for a reduction reaction, and then the reduction reaction was advanced at 290° C. for 1 hour. When the reduction reaction was completed, the temperature of the reactor was gently lowered to the room temperature over 3 hours. The thus synthesized carbon nanotube-iron oxide composite was filtered by using a filter bed, and then washed with ethyl acetate and methanol (MeOH) several times, followed by drying in an oven at 80° C. for 1 hour, thereby obtaining a final composite. As the analysis result of the thus manufactured carbon nanotube-iron oxide composite, it can be confirmed from FIG. 1, that iron oxide particles were spherical and uniformly dispersed with a size of about 10 nm. In addition, it can be confirmed from energy dispersive X-ray spectroscopy results of FIG. 2, that the particles are iron oxide.

Example 2

Figure 3:
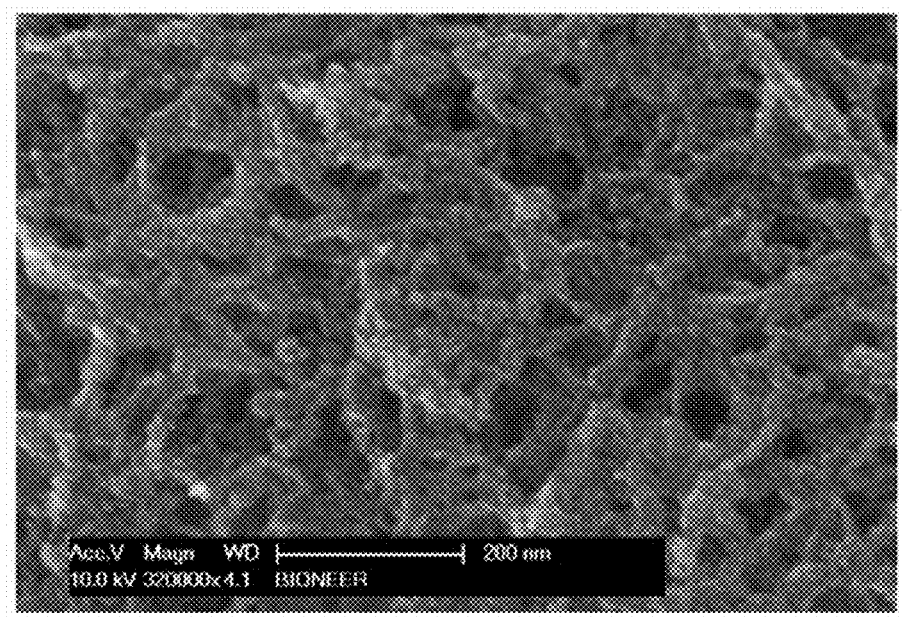
FIG. 3 is a scanning electronic microscope (SEM) image of a carbon nanotube-iron oxide composite manufactured in Example 2.

Change in Size and Shape of Iron Oxide Particle Depending on Reduction Reaction Temperature 0.3 g of multi-wall carbon nanotubes (Cheil Industries Inc.; Multi-wall CNT grade) were put in a 500 ml four-neck round flask reactor, and 280 ml of triethylene glycol was put in the round flask reactor. After stirring for 30 minutes by using an equipped stirrer, the reactor was placed in an ultrasonic wave washing machine, and then the carbon nanotubes were dispersed in the triethylene glycol for 3 hours by using ultrasonic waves. Here, the temperature of the reactor should not exceed 50° C. After the ultrasonic treatment was completed, the stirrer was again equipped with the reactor and then a thermometer and a cooling condenser were connected thereto. While the reactor was stirred, 4.26 ml of methyl polyglycol ($CH_3(OCH_2CH_2)_nOH$, n=4~5, Hannon Chemicals Inc., Product Name: MPG) was put thereinto, and then 1.89 g of Fe(III)-acetylacetonate was put thereinto. A vacuum pump was connected to the reactor to remove air inside the reactor, which was then replaced with nitrogen. A mantle was installed below the flask reactor. The inside temperature of the reactor was raised to 270° C. over 40 minutes for heat treatment for a reduction reaction, and then the reduction reaction was advanced at 270° C. for 1 hour. When the reduction reaction was completed, the temperature of the reactor was gently lowered to the room temperature over 3 hours. The thus synthesized carbon nanotube-iron oxide composite was filtered by using a filter bed, and then washed with ethyl acetate and methanol (MeOH) several times, followed by drying in an oven at 80° C. for 1 hour, thereby obtaining a final composite. The scanning electron microscope (SEM) analysis result of the thus manufactured carbon nanotube-iron oxide composite is shown in FIG. 3, and it can be confirmed therefrom that iron oxide particles were uniformly dispersed with a size of average 8 nm.

Example 3

Figure 4:
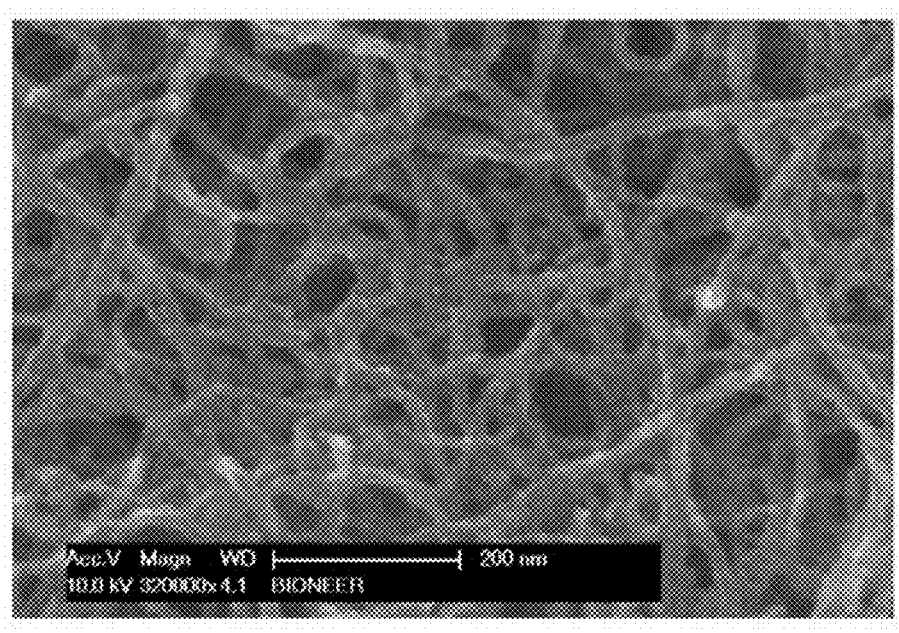
FIG. 4 is a scanning electronic microscope (SEM) image of a carbon nanotube-iron oxide composite manufactured in Example 3.

0.3 g of multi-wall carbon nanotubes (Cheil Industries Inc.; Multi-wall CNT grade) were put in a 500 ml four-neck round flask reactor, and 280 ml of triethylene glycol was put in the round flask reactor. After stirring for 30 minutes by using an equipped stirrer, the reactor was placed in an ultrasonic wave washing machine, and then the carbon nanotubes were dispersed in the triethylene glycol for 3 hours by using ultrasonic waves. Here, the temperature of the reactor should not exceed 50° C. After the ultrasonic treatment was completed, the stirrer was again equipped with the reactor and then a thermometer and a cooling condenser were connected thereto. While stirring, 4.26 ml of methyl polyglycol ($CH_3(OCH_2CH_2)_nOH$, n=4~5, Hannon Chemicals Inc., Product Name: MPG) was put thereinto, and then 1.89 g of Fe(III)-acetylacetonate was put thereinto. A vacuum pump was connected to the reactor to remove air inside the reactor, which was then replaced with nitrogen. A mantle was installed below the flask reactor. The inside temperature of the reactor was raised to 250° C. over 40 minutes for heat treatment for a reduction reaction, and then the reduction reaction was increased at 250° C. for 1 hour. When the reduction reaction was completed, the temperature of the reactor was slowly lowered to the room temperature over 3 hours. The thus synthesized carbon nanotube-iron oxide composite was filtered by using a filter bed, and then washed with ethyl acetate and methanol (MeOH) several times, followed by drying in an oven at 80° C. for 1 hour, thereby obtaining a final composite. The scanning electron microscope (SEM) analysis result of the thus manufactured carbon nanotube-iron oxide composite is shown in FIG. 4, and it can be confirmed therefrom that iron oxide particles have an average size of 5 nm or less, and the iron oxide was completely coated on surfaces of the carbon nanotubes.

Example 4

Figure 5:
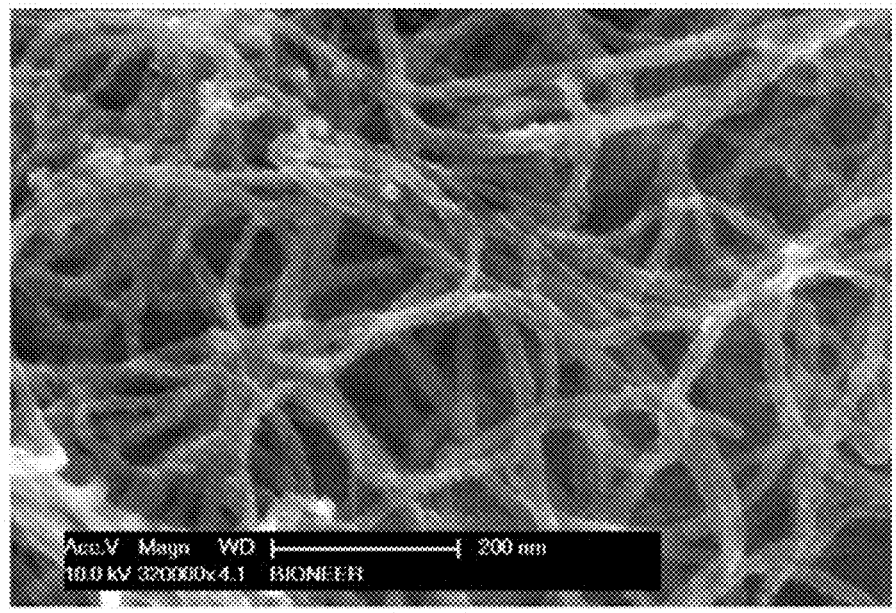
FIG. 5 is a scanning electronic microscope (SEM) image of a carbon nanotube-iron oxide composite manufactured in Example 4.

0.3 g of multi-wall carbon nanotubes (Cheil Industries Inc.; Multi-wall CNT grade) were put in a 500 ml four-neck round flask reactor, and 280 ml of triethylene glycol was put in the round flask reactor. After stirring for 30 minutes by using an equipped stirrer, the reactor was placed in an ultrasonic wave washing machine, and then the carbon nanotubes were dispersed in the triethylene glycol for 3 hours by using ultrasonic waves. Here, the temperature of the reactor should not exceed 50° C. After the ultrasonic treatment was completed, the stirrer was again equipped with the reactor and then a thermometer and a cooling condenser were connected thereto. While the reactor was stirred, 4.26 ml of methyl polyglycol ($CH_3(OCH_2CH_2)nOH$, n=4~5, Hannon Chemicals Inc., Product Name: MPG) was put thereinto, and then 1.89 g of Fe(III)-acetylacetonate was put thereinto. A vacuum pump was connected to the reactor to remove air inside the reactor, which was then replaced with nitrogen. A mantle was installed below the flask reactor. The inside temperature of the reactor was raised to 230° C. over 40 minutes for heat treatment for a reduction reaction, and then the reduction reaction was advanced at 230° C. for 1 hour. When the reduction reaction was completed, the temperature of the reactor was gently lowered to the room temperature over 3 hours. The thus synthesized carbon nanotube-iron oxide composite was filtered by using a filter bed, and then washed with ethyl acetate and methanol (MeOH) several times, followed by drying in an oven at 80° C. for 1 hour, thereby obtaining a final composite. The scanning electron microscope (SEM) analysis result of the thus manufactured carbon nanotube-iron oxide composite is shown in FIG. 5, and it can be confirmed therefrom that iron oxide particles have an average size of 3 nm or less, and the iron oxide was completely coated on surfaces of the carbon nanotubes.

Example 5

Figure 6:
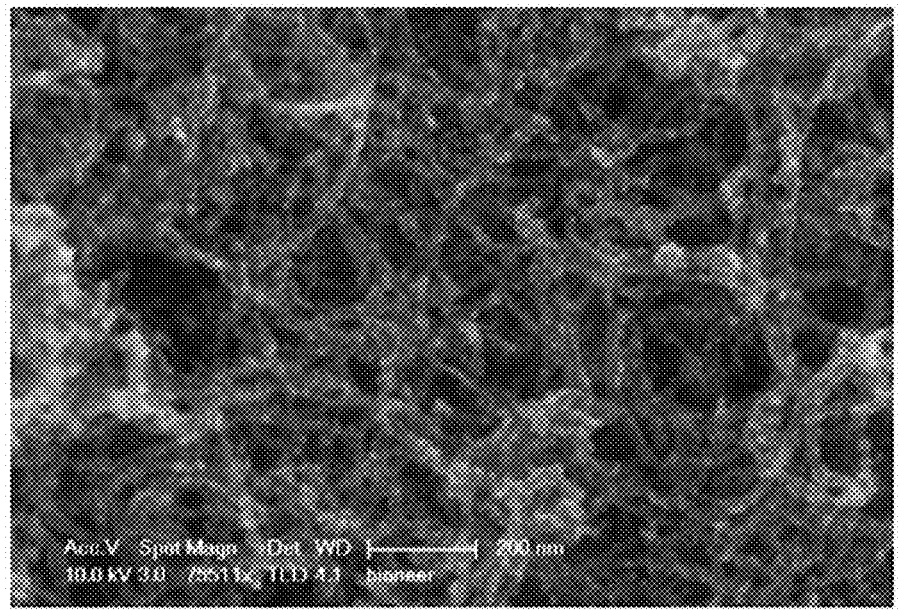
FIG. 6 is a scanning electronic microscope (SEM) image of a carbon nanotube-tin oxide composite manufactured in Example 5.
Figure 7:
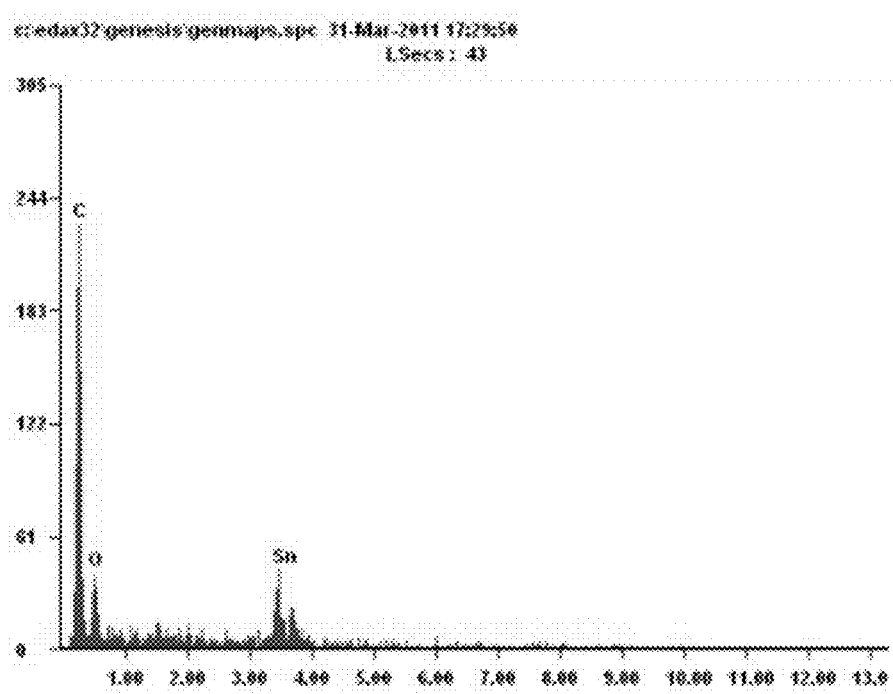
FIG. 7 shows an EDS analysis result of the carbon nanotube-tin oxide composite manufactured in Example 5.
Figure 8:
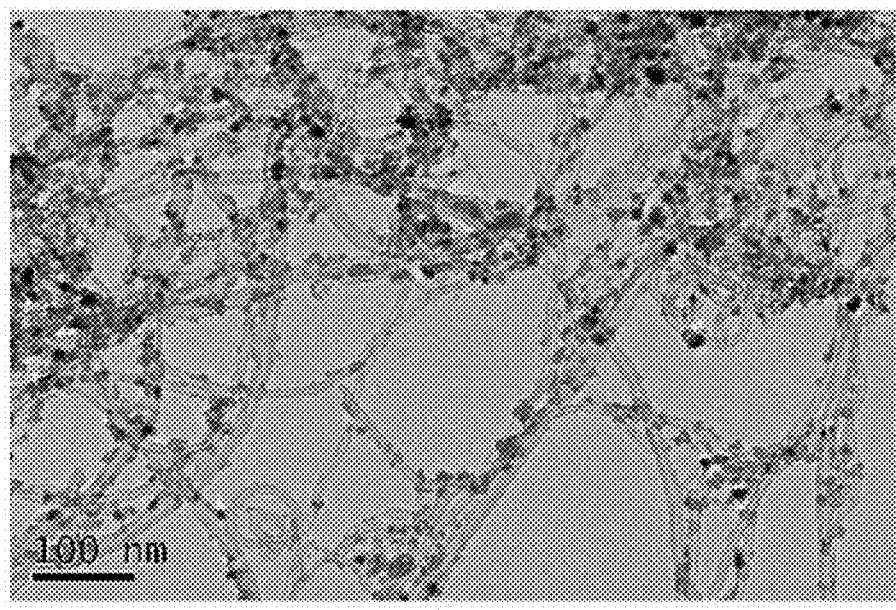
FIG. 8 is a transmission electronic microscope (TEM) image of the carbon nanotube-tin oxide composite manufactured in Example 5.
Figure 9:
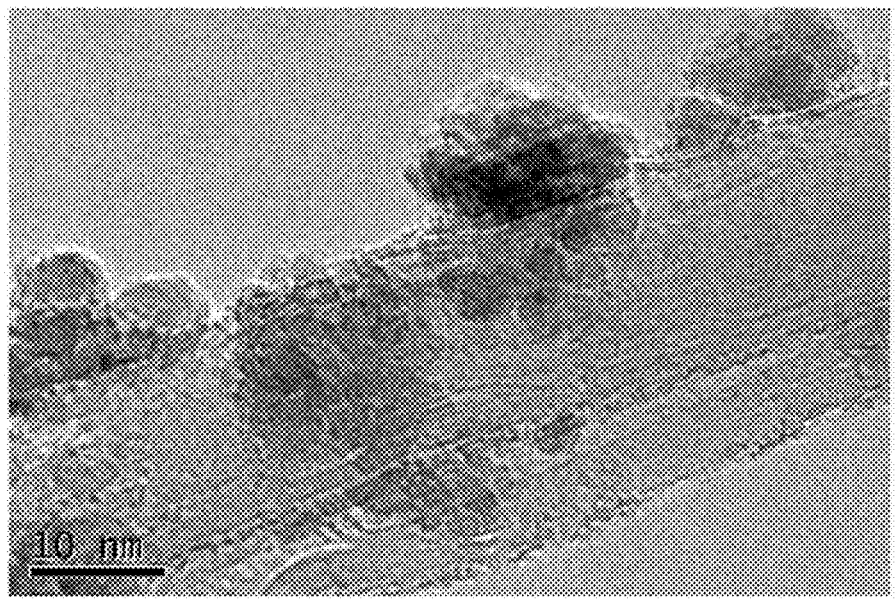
FIG. 9 is a transmission electronic microscope (TEM) image at high magnification of the carbon nanotube-tin oxide composite manufactured in Example 5.

Manufacture of Carbon Nanotube-Tin Oxide Composite Using Multi-Wall Carbon Nanotube 0.3 g of multi-wall carbon nanotubes (Hanwha Nanotech Inc.; Multi-wall CNT CM-95 grade) were put in a 500 ml four-neck round flask reactor, and 280 ml of triethylene glycol was put in the round flask reactor. After stirring for 30 minutes by using an equipped stirrer, the reactor was placed in an ultrasonic wave washing machine, and then the carbon nanotubes were dispersed in the triethylene glycol for 3 hours by using ultrasonic waves. Here, the temperature of the reactor should not exceed 50° C. After the ultrasonic treatment was completed, the stirrer was again equipped with the reactor and then a thermometer and a cooling condenser were connected thereto. While the reactor was stirred, 4.26 ml of methyl polyglycol ($CH_3(OCH_2CH_2)_nOH$, n=4~5, Hannon Chemicals Inc., Product Name: MPG) was put thereinto, and then 2.389 g of tin(II)-ethylhexanoate was put thereinto. A vacuum pump was connected to the reactor to remove air inside the reactor, which was then replaced with nitrogen. The nitrogen is continuously put thereinto and is allowed to flow through to the inside of the reactor, thereby preventing the inflow of oxygen. A mantle was installed below the flask reactor. The inside temperature of the reactor was raised to 290° C. over 40 minutes for heat treatment for a reduction reaction, and then the reduction reaction was advanced at 290° C. for 1 hour. When the reduction reaction was completed, the temperature of the reactor was gently lowered to the room temperature over 3 hours. The thus synthesized carbon nanotube-tin oxide composite was filtered by using a filter bed, and then washed with ethyl acetate and methanol (MeOH) several times, followed by drying in an oven at 80° C. for 1 hour, thereby obtaining a final composite. As the scanning electron microscope (SEM) analysis result of the thus manufactured carbon nanotube-tin oxide composite, it can be confirmed from FIG. 6, that tin oxide particles were uniformly dispersed with a size of about 10 nm. In addition, it can be confirmed from energy dispersive X-ray spectroscopy results of FIG. 7, that the particles are tin oxide. The manufactured carbon nanotube-tin oxide composite was confirmed in detail by using a transmission electronic microscope (TEM), as shown in FIGS. 8 and 9.

The invention claimed is:

1. A method for manufacturing a carbon nanotube-iron oxide composite, the method comprising:
    dispersing carbon nanotubes in a reductive solvent to prepare a dispersion liquid;
    adding a co-reducing agent and an iron precursor to the dispersion liquid to prepare a mixture liquid; and
    subjecting the mixture liquid to a heat treatment at a temperature of 230° C. to 250° C. to give the carbon nanotube iron oxide composite, wherein the iron oxide of the carbon nanotube-iron oxide composite has a particle size of 5 nm or less,
    wherein the reductive solvent comprises triethylene glycol; and the co-reducing agent comprises a methyl polyglycol having the formula $(CH_3(OCH_2CH_2)_nOH)$ n=4-5.

2. The method of claim 1, wherein the reductive solvent further comprises at least one selected from the group consisting of ethylene glycol, diethylene glycol, tetraethylene glycol, polyethylene glycol, propylene glycol, dipropylene glycol, polypropylene glycol, and hexylene glycol.

3. The method of claim 1, wherein the co-reducing agent further comprises at least one selected from the group consisting of methyl glycol, methyl diglycol, methyl triglycol, ethyl glycol, ethyl diglycol, butyl glycol, butyl diglycol, butyl triglycol, butyl polyglycol, hexyl glycol, hexyl diglycol, ethyl hexyl glycol, ethyl hexyl diglycol, allyl glycol, phenyl glycol, phenyl diglycol, benzyl glycol, benzyl diglycol, methyl propylene glycol, methyl propylene diglycol, methyl propylene triglycol, propyl propylene glycol, propyl propylene diglycol, butyl propylene glycol, butyl propylene diglycol, phenyl propylene glycol, and methyl propylene glycol acetate.

4. The method of claim 1, wherein the iron precursor is at least one selected from the group consisting of a hydroxy compound of iron, a carbonate compound of iron, a chloride compound of iron, a sulfate compound of iron, a nitrate compound of iron, a carboxylate compound of Chemical Formula 3, a hydrate thereof, a β-diketonate compound of Chemical Formula 4, and a hydrate thereof:

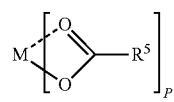

Chemical Formula 3

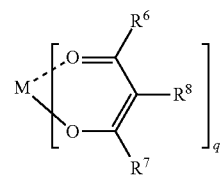

Chemical Formula 4 wherein M is Fe; $R_5$, $R_6$ and $R_7$ each are independently an allyl, $C_1$-$C_{10}$ alkyl, $C_5$-$C_{20}$ aryl, or $C_6$-$C_{30}$ aralkyl; $R_8$ is a hydrogen atom or $C_1$-$C_7$ alkyl; and p and q each are independently a valence of M.

* * * * *